US012690196B2

(12) United States Patent
    Tsunekawa

(10) Patent No.: US 12,690,196 B2
(45) Date of Patent: Jul. 21, 2026

(54) STACKED STRUCTURE, MEMORY DEVICE AND METHOD OF MANUFACTURING STACKED STRUCTURE

(71) Applicant: CANON ANELVA CORPORATION, Kawasaki (JP)

(72) Inventor: Koji Tsunekawa, Tokyo (JP)

(73) Assignee: CANON ANELVA CORPORATION, Kawasaki (JP)

( * ) Notice: Subject to any disclaimer, the term of this patent is extended or adjusted under 35 U.S.C. 154(b) by 738 days.

(21) Appl. No.: 17/851,178

(22) Filed: Jun. 28, 2022

(65) Prior Publication Data

US 2022/0415912 A1      Dec. 29, 2022

(30) Foreign Application Priority Data

Jun. 29, 2021     (JP) ................................. 2021-107796

(51) Int. Cl.
    *H10B 53/00*       (2023.01)
    *G11C 11/22*       (2006.01)
    *H10B 53/30*       (2023.01)

(52) U.S. Cl.
    CPC ............ H10B 53/00 (2023.02); G11C 11/221 (2013.01); H10B 53/30 (2023.02)

(58) Field of Classification Search
    CPC ........ H10B 53/30; H10B 53/00; G11C 11/221
    See application file for complete search history.

(56) References Cited

U.S. PATENT DOCUMENTS

| | | | |
|---|---|---|---|
| 6,790,741 B1 | 9/2004 | Tatsumi | |
| 9,490,054 B2 | 11/2016 | Jan et al. | |
| 10,692,927 B1 | 6/2020 | Gottwald | |
| 10,847,623 B2 | 11/2020 | Chen et al. | |
| 11,018,239 B2 | 5/2021 | Chen et al. | |
| 2004/0135182 A1* | 7/2004 | An ......................... | H10D 1/696 |
| | | | 257/295 |
| 2004/0224459 A1 | 11/2004 | Nishikawa | |
| 2007/0096229 A1 | 5/2007 | Yoshikawa et al. | |
| 2008/0123243 A1* | 5/2008 | Hamada .................. | H01G 4/33 |
| | | | 361/301.1 |
| 2010/0001325 A1* | 1/2010 | Sashida ............. | H01L 21/76883 |
| | | | 257/295 |
| 2011/0316059 A1 | 12/2011 | Ahn et al. | |
| 2015/0380641 A1 | 12/2015 | Ino et al. | |

(Continued)

FOREIGN PATENT DOCUMENTS

| | | |
|---|---|---|
| CN | 104823292 A | 8/2015 |
| CN | 110527978 A | 12/2019 |

(Continued)

OTHER PUBLICATIONS

Hayden et al., Phys. Rev. Materials 5, 044412 (Year: 2021).*

(Continued)

*Primary Examiner* — Ratisha Mehta
*Assistant Examiner* — Adam Joseph Mott
(74) *Attorney, Agent, or Firm* — BUCHANAN INGERSOLL & ROONEY PC

(57) ABSTRACT

A stacked structure includes a ferroelectric layer, and a tunnel barrier layer joined to the ferroelectric layer. The main component of the ferroelectric layer is aluminum nitride, and the main component of the tunnel barrier layer is magnesium oxide.

16 Claims, 2 Drawing Sheets

(56) References Cited

U.S. PATENT DOCUMENTS

| | | | |
|---|---|---|---|
| 2016/0190346 A1 | 6/2016 | Kawata et al. | |
| 2016/0365133 A1 | 12/2016 | Ino et al. | |
| 2018/0269216 A1 | 9/2018 | Lee | |
| 2019/0088664 A1 | 3/2019 | Kabuyanagi et al. | |
| 2019/0305042 A1* | 10/2019 | Chen | G11C 11/1673 |
| 2020/0321344 A1 | 10/2020 | Ramesh et al. | |
| 2020/0357976 A1 | 11/2020 | Teshigahara et al. | |
| 2020/0411747 A1 | 12/2020 | Wagner et al. | |
| 2021/0074817 A1 | 3/2021 | Chen et al. | |
| 2021/0151445 A1 | 5/2021 | Wagner et al. | |
| 2021/0398991 A1* | 12/2021 | Manfrini | H10D 30/701 |
| 2022/0051965 A1 | 2/2022 | Terasaki | |
| 2023/0380180 A1* | 11/2023 | Yamazaki | H01L 21/02164 |

FOREIGN PATENT DOCUMENTS

| | | | |
|---|---|---|---|
| CN | 110957353 A | 4/2020 | |
| CN | 111834457 A | 10/2020 | |
| JP | 2001077112 A | 3/2001 | |
| JP | 2001127258 A | 5/2001 | |
| JP | 2003158309 A | 5/2003 | |
| JP | 2007150265 A | 6/2007 | |
| JP | 2007324167 A | 12/2007 | |
| JP | 2013107782 A | 6/2013 | |
| JP | 2019057621 A | 4/2019 | |
| JP | 2019145677 A | 8/2019 | |
| JP | 2019146284 A | 8/2019 | |
| JP | 2020508394 A | 3/2020 | |
| JP | 2020113604 A | 7/2020 | |
| JP | 2020202200 A | 12/2020 | |
| JP | 2021009893 A | 1/2021 | |
| TW | 201633410 A | 9/2016 | |
| WO | 2015045592 A1 | 4/2015 | |
| WO | 2015141625 A1 | 9/2015 | |
| WO | 2018145815 A1 | 8/2018 | |
| WO | 2020261833 A1 | 12/2020 | |

OTHER PUBLICATIONS

Fichtner et al., J. Appl. Phys. 125, 114103 (Year: 2019).*

Yasuoka et al., J. Appl. Phys. 128, 114103 (Year: 2020).*

Office Action (Notice of Preliminary Rejection) issued on Aug. 28, 2023, by the Intellectual Property Office in corresponding Korean Patent Application No. 10-2022-0076596, and an English Translation of the Office Action. (10 pages).

Mikolajick, et al., The Past, the Present, and the Future of Ferroelectric Memories, IEEE Tran. on Elec. Dev., vol. 67, No. 4, Apr. 2020, pp. 1434-1443.

Office Action (Grounds for Rejection) issued on Jun. 2, 2023, by the Japanese Patent Office in corresponding Japanese Patent Application No. 2021-107796, and an English Translation of the Office Action. (13 pages).

Office Action issued on Jul. 7, 2023, by the Taiwanese Patent Office in corresponding Taiwanese Patent Application No. 111122363, and an English Translation of the Office Action. (15 pages).

Office Action (Notice of Reasons for Refusal) issued on Mar. 29, 2024, by the Japanese Patent Office in corresponding Japanese Patent Application No. 2023-121897, and an English Translation of the Office Action. (8 pages).

Fichtner, S., et al., "AlScN: AIII-V semiconductor based ferroelectric", Journal of Applied Physics, vol. 125, 114103 (2019). (7 pages).

Fujii, S. and Saitoh, M., "Ferroelectric Tunnel Junction Memory with HfO2 Thin Film", Toshiba Review, vol. 72, No. 4, 2017, pp. 65-68, with English Translation. (18 pages).

Garcia, V. and Bibes, M., "Ferroelectric tunnel junctions for information storage and processing", Nature Communications, 5, 4289 (2014). (12 pages).

Ma, Z., et al., "Tunneling electroresistance effect in Pt/MgO/Pt/PbTiO3/Pt ferroelectric tunnel junctions", Applied Physics Letters 101, 022906 (2012), https://doi.org/10.1063/1.4734513. (6 pages).

Max, Benjamin, et al., "Ferroelectric Tunnel Junctions based on Ferroelectric-Dielectric Hf0.5Zr0.502/Al2O3 Capacitor Stacks", 48th ESSDERC, 2018, pp. 142-145. (4 pages).

Yasuoka, S., et al., "Effects of deposition conditions on the ferroelectric properties of (Al1-xScx)N thin films", Journal of Applied Physics, vol. 128, 114103 (2020). (12 pages).

Notification of the First Office Action issued on Apr. 22, 2025, by the Chinese Patent Office in corresponding Chinese Patent Application No. 202210746286.2, and an English Translation of the Office Action. (14 pages).

Office Action (Notification of Second Office Action) issued on Sep. 24, 2025, by the Chinese Patent Office in corresponding Chinese Patent Application No. 202210746286.2, and an English Translation of the Office Action. (12 pages).

* cited by examiner

10

S1

4

2

3

1

5

6

100"

BL

WL

ST

C

PL

MC

STACKED STRUCTURE, MEMORY DEVICE AND METHOD OF MANUFACTURING STACKED STRUCTURE

BACKGROUND OF THE INVENTION

Field of the Invention

The present invention relates to a stacked structure, a memory device, and a method of manufacturing a stacked structure.

Description of the Related Art

A conventional ferroelectric memory including only a ferroelectric layer arranged between two electrodes has a disadvantage of destructive read. On the other hand, a memory device including a ferroelectric tunnel junction with a structure in which a ferroelectric layer and a tunnel barrier layer are stacked can nondestructively read data and is therefore expected to be applied to a high-speed random access memory and a mass storage class memory of the next generation (non-patent literature 1). As ferroelectric materials used for the ferroelectric layer in the ferroelectric tunnel junction, $HfO_2$ and $HfZrO_2$ formed by doping $HfO_2$ with Zr are known (non-patent literatures 2 and 3). AlScN, which has a wurtzite structure and is obtained by doping aluminum nitride (AlN) with scandium (Sc), has recently been found as a ferroelectric material that exhibits a larger residual polarization value (non-patent literature 4). To apply this to a memory, approach to reduce the film thickness has been promoted (non-patent literature 5). In addition, as an insulating material used for the tunnel barrier layer, $Al_2O_3$ is known (non-patent literature 2).

In the conventional ferroelectric tunnel junction and a memory device using this, to reverse the direction of polarization, a high voltage is applied between upper and lower electrodes. At this time, in a ferroelectric tunnel junction thin film that uses $Al_2O_3$ as the material of the tunnel barrier layer, there is a high possibility that the tunnel barrier layer will cause dielectric breakdown.

[Non-Patent Literature 1] V. Garcia & M. Bibes, "Nature Communications", 5, 4289 (2014)

[Non-Patent Literature 2] B. Max et al, "48th ESSDERC", 2018, pp. 142-145

[Non-Patent Literature 3] S. Fujii & M. Saitoh, "Toshiba Review", Vol. 72, No. 4, (2017) pp. 66-68

[Non-Patent Literature 4] S. Fichtner et al, "Journal of Applied Physics", Vol. 125, 114103 (2019)

[Non-Patent Literature 5] S. Yasuoka et al, "Journal of Applied Physics", Vol. 128, 114103 (2020)

SUMMARY OF THE INVENTION

The present invention provides a technique advantageous in improving the dielectric breakdown voltage of a tunnel barrier layer.

The first aspect of the present invention provides a stacked structure comprising a ferroelectric layer, and a tunnel barrier layer joined to the ferroelectric layer, wherein a main component of the ferroelectric layer is aluminum nitride, and a main component of the tunnel barrier layer is magnesium oxide.

The second of the present invention provides a memory device comprising a capacitor including a stacked structure defined as the first aspect of the present invention.

The third aspect of the present invention provides a method of manufacturing a stacked structure, comprising forming a junction between a ferroelectric layer and a tunnel barrier layer, wherein a main component of the ferroelectric layer is aluminum nitride, and a main component of the tunnel barrier layer is magnesium oxide.

Further features of the present invention will become apparent from the following description of exemplary embodiments with reference to the attached drawings.

DESCRIPTION OF THE EMBODIMENTS

Figure 1:
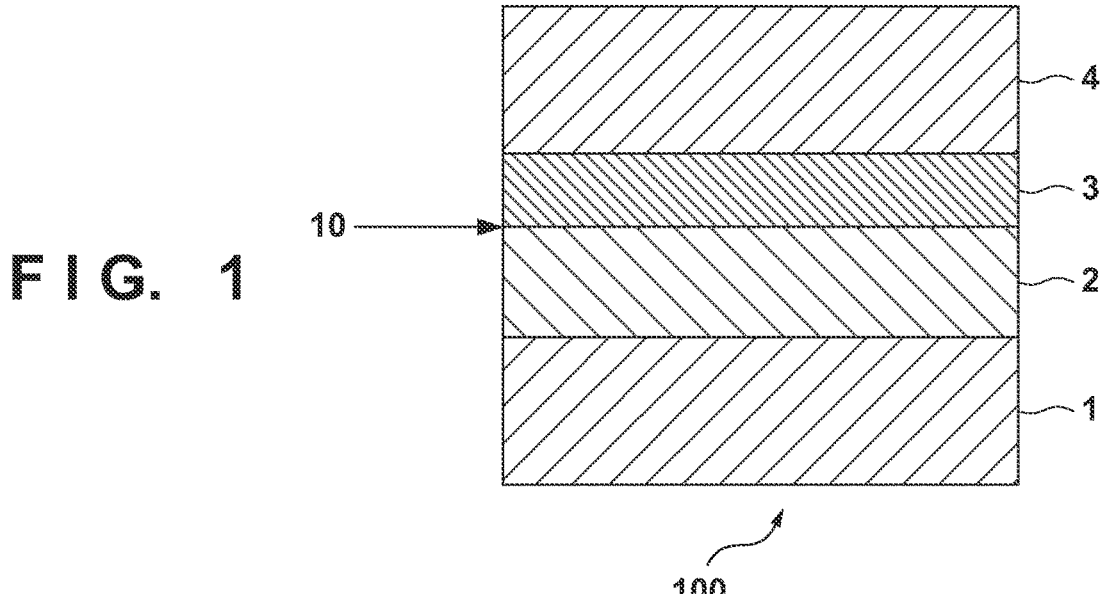
FIG. 1 is a sectional view schematically showing the structure of a stacked structure or a ferroelectric tunnel junction according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 exemplarily shows the configuration of a stacked structure 100 according to an embodiment. The stacked structure 100 can include a ferroelectric layer 2, and a tunnel barrier layer 3 joined to the ferroelectric layer 2. The ferroelectric layer 2 and the tunnel barrier layer 3 are joined to each other via a junction surface 10. The stacked structure 100 can also be called a ferroelectric tunnel junction.

The main component of the ferroelectric layer 2 can be, for example, aluminum nitride (AlN). The ferroelectric layer 2 can contain aluminum nitride at a concentration of, for example, 50 at % or more, 60 at % or more, 70 at % or more, 80 at % or more, 85 at % or more, 90 at % or more, or 95 at % or more. The main component of the tunnel barrier layer 3 can be, for example, magnesium oxide (MgO). The tunnel barrier layer 3 can contain magnesium oxide at a concertation of, for example, 50 at % or more, 60 at % or more, 70 at % or more, 80 at % or more, 85 at % or more, 90 at % or more, 95 at % or 98 at % or more. The tunnel barrier layer 3 is an insulator.

The stacked structure 100 may include a first electrode 1 and a second electrode 4, and the ferroelectric layer 2 and the tunnel barrier layer 3 can be arranged between the first electrode 1 and the second electrode 4. In an example, the first electrode 1 is a lower electrode, the second electrode 4 is an upper electrode, and the tunnel barrier layer 3 can be arranged between the ferroelectric layer 2 and the second electrode 4. In another example, the first electrode 1 is a lower electrode, the second electrode 4 is an upper electrode, and the tunnel barrier layer 3 can be arranged between the first electrode 1 and the ferroelectric layer 2.

In an example, the ferroelectric layer 2 can be deposited on the first electrode 1, the tunnel barrier layer 3 can be deposited on the ferroelectric layer 2, and the second electrode 4 can be deposited on the tunnel barrier layer 3.

The first electrode 1 has an NaCl structure, and the (111) surface of the NaCl structure is preferably along the upper surface of the first electrode 1 or the junction surface 10. In other words, the first electrode 1 is preferably a (111) oriented film having an NaCl structure whose (111) surface is almost parallel to the upper surface of the first electrode 1 or the junction surface 10. Here, the upper surface of the first electrode 1 is a facing surface S1 that faces the second electrode 4 via the ferroelectric layer 2 and the tunnel barrier layer 3.

A more detailed example will be described. The first electrode 1 is preferably a titanium nitride (TiN) film having an NaCl structure whose (111) surface is along the upper surface of the first electrode 1 or the junction surface 10. In another viewpoint, the first electrode 1 can be a conductor film configured to facilitate forming, on the first electrode 1, the ferroelectric layer 2 having a wurtzite structure whose (001) surface is along the junction surface 10.

The ferroelectric layer 2 can be made of a ferroelectric whose main component is aluminum nitride. When a sub-component is added to the main component, the ferroelectric layer 2 can exhibit ferroelectricity. The sub-component can include, for example, at least one of scandium (Sc) and boron (B). However, the present invention is not limited to this. The ferroelectric layer 2 is preferably a film having a wurtzite structure whose (001) surface is along the junction surface 10, in other words, a (001) oriented film whose (001) surface is almost parallel to the junction surface 10.

The tunnel barrier layer 3 can be made of an insulator whose main component is, for example, magnesium oxide (MgO). The tunnel barrier layer 3 is preferably a film having an NaCl structure whose (111) surface is along the junction surface 10, in other words, a (111) oriented film whose (111) surface is almost parallel to the junction surface 10.

The second electrode 4 can be made of a conductor that hardly causes heat diffusion between the second electrode 4 and the tunnel barrier layer 3 even under a heat load. The second electrode 4 can be, for example, a titanium nitride (TiN) film, but may be made of another conductor.

In another example, the tunnel barrier layer 3 can be deposited on the first electrode 1, the ferroelectric layer 2 can be deposited on the tunnel barrier layer 3, and the second electrode 4 can be deposited on the ferroelectric layer 2.

According to this embodiment, the dielectric breakdown voltage of the tunnel barrier layer 3 improves.

Figure 2:
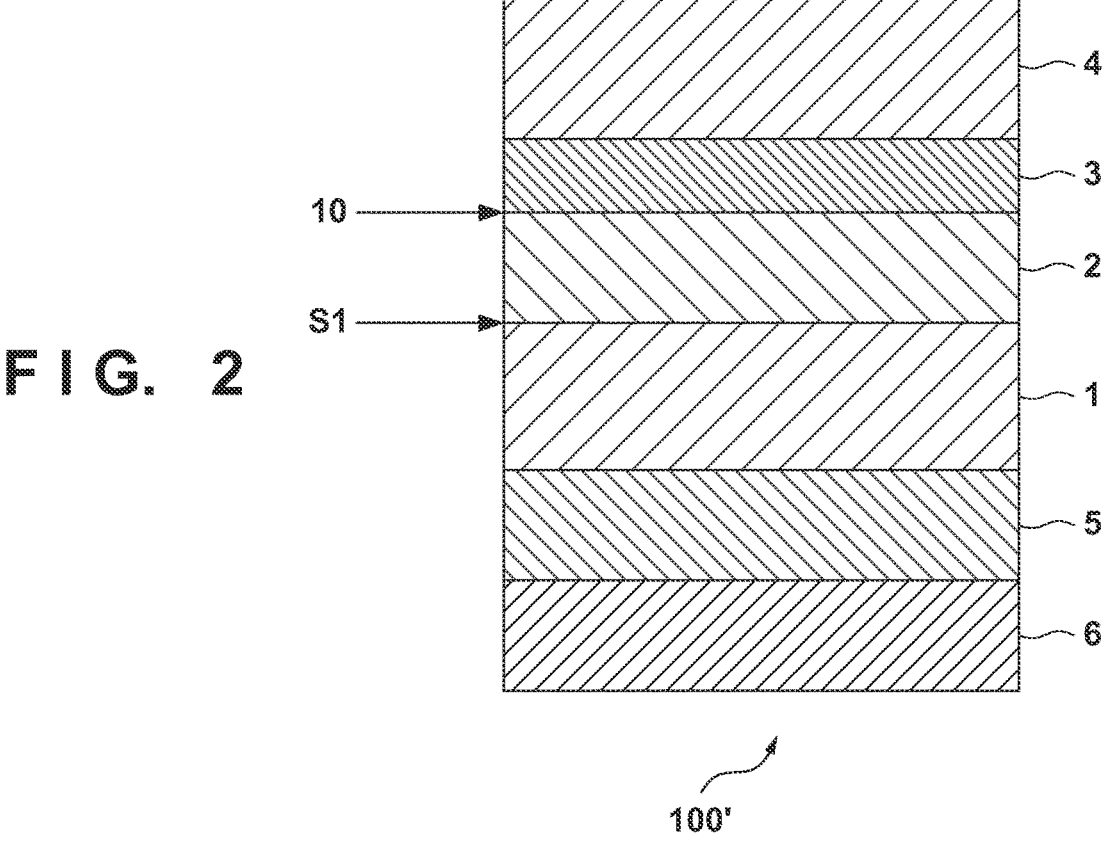
FIG. 2 is a sectional view schematically showing the structure of a stacked structure or a ferroelectric tunnel junction according to Example 1.

FIG. 2 exemplarily shows a stacked structure 100' according to Example 1 and a method of manufacturing the same. The stacked structure 100' can include a first electrode 1, a ferroelectric layer 2 deposited or arranged on the first electrode 1, a tunnel barrier layer 3 deposited or arranged on the ferroelectric layer 2, and a second electrode 4 deposited or arranged on the tunnel barrier layer 3. The stacked structure 100' can also be called a ferroelectric tunnel junction.

The first electrode 1 can be a TiN film having an NaCl structure whose (111) surface is along a junction surface 10. The first electrode 1 can have a thickness within the range of 10 nm (inclusive) to 50 nm (inclusive). To promote (111) orientation of the TiN film serving as the first electrode 1, a tantalum (Ta) film having a thickness within the range of 5 nm (inclusive) to 10 nm (inclusive) is formed as an underlying layer 6, and a ruthenium (Ru) film having a thickness within the range of 2 nm (inclusive) to 10 nm (inclusive) is formed on this as a seed layer 5. Here, the seed layer 5 may be made of platinum (Pt), nickel (Ni), or titanium (Ti). The seed layer 5 may be made of an alloy containing Ru, Pt, Ni, or Ti as the main component. Also, the underlying layer 6 may be made of tantalum nitride (TaN), Ru, or Pt, and the underlying layer 6 may be omitted depending on the material and structure of the substrate surface immediately under the underlying layer 6.

The ferroelectric layer 2 can be deposited on the first electrode 1. The ferroelectric layer 2 can contain, for example, aluminum nitride (AlN) as the main component, and can contain boron (B) as a sub-component within the range of 2 at % (inclusive) to 10 at % (inclusive). The ferroelectric layer 2 can have a thickness within the range of, for example, 5 nm (inclusive) to 20 nm (inclusive). The ferroelectric layer 2 is preferably thin as long as it maintains ferroelectricity. The sub-component may be, for example, scandium (Sc). In this case, the Sc addition amount preferably falls within the range of, for example, 5 at % (inclusive) to 45 at % (inclusive).

The tunnel barrier layer 3 can be deposited on the ferroelectric layer 2. The tunnel barrier layer 3 can be made of, for example, magnesium oxide (MgO). The tunnel barrier layer 3 can have a thickness within the range of, for example, 1 nm (inclusive) to 4 nm (inclusive). When the tunnel barrier layer 3 is deposited or formed on the ferroelectric layer 2, a junction between the ferroelectric layer 2 and the tunnel barrier layer 3 is formed.

The second electrode 4 can be deposited on the tunnel barrier layer 3. The second electrode 4 can be made of a conductor film such as TiN. The second electrode 4 can have a thickness of, for example, 10 nm (inclusive) to 50 nm (inclusive).

To manufacture the stacked structure 100' or the ferroelectric tunnel junction, a sputtering film-forming method can be employed. Here, the process from formation of the underlying layer 6 to formation of the second electrode 4 is preferably executed under a vacuum environment without exposure to atmosphere.

Figures 3, 4:
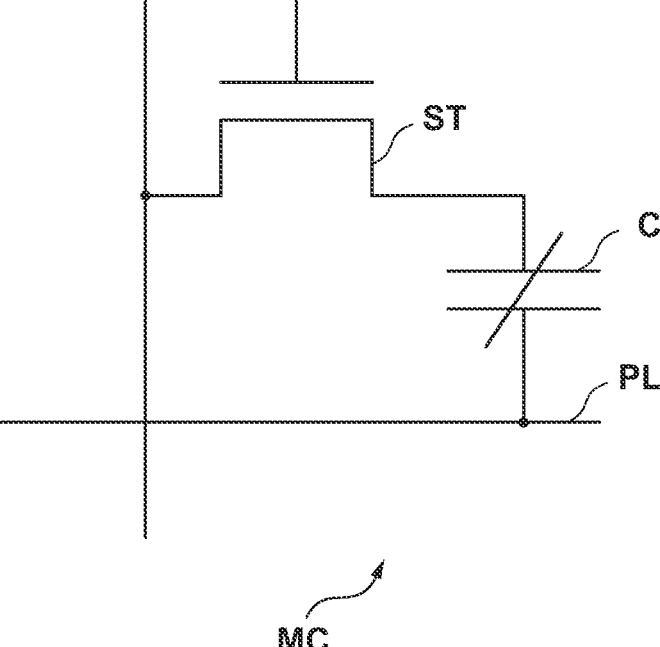
FIG. 3 is a sectional view schematically showing the structure of a stacked structure or a ferroelectric tunnel junction according to Example 2.
FIG. 4 is a view showing the configuration of one memory cell of a memory device according to an embodiment.

FIG. 3 exemplarily shows a stacked structure 100'' according to Example 2 and a method of manufacturing the same. The stacked structure 100'' can include a first electrode 1, a tunnel barrier layer 3 deposited or arranged on the first electrode 1, a ferroelectric layer 2 deposited or arranged on the tunnel barrier layer 3, and a second electrode 4 deposited or arranged on the ferroelectric layer 2. The stacked structure 100'' can also be called a ferroelectric tunnel junction.

The first electrode 1 can be a TiN film having an NaCl structure whose (111) surface is along a junction surface 10. The first electrode 1 can have a thickness within the range of 10 nm (inclusive) to 50 nm (inclusive). To promote (111) orientation of the TiN film serving as the first electrode 1, a tantalum (Ta) film having a thickness within the range of 5 nm (inclusive) to 10 nm (inclusive) is formed as an underlying layer 6, and a ruthenium (Ru) film having a thickness within the range of 2 nm (inclusive) to 10 nm (inclusive) is formed on this as a seed layer 5. Here, the seed layer 5 may be made of platinum (Pt), nickel (Ni), or titanium (Ti). The seed layer 5 may be made of an alloy containing Ru, Pt, Ni, or Ti as the main component. Also, the underlying layer 6 may be made of tantalum nitride (TaN), Ru, or Pt, and the underlying layer 6 may be omitted depending on the material and structure of the substrate surface immediately under the underlying layer 6.

The tunnel barrier layer 3 can be deposited on the first electrode 1. The tunnel barrier layer 3 can be made of, for example, magnesium oxide (MgO). The tunnel barrier layer 3 can have a thickness within the range of, for example, 1 nm (inclusive) to 4 nm (inclusive).

The ferroelectric layer 2 can be deposited on the tunnel barrier layer 3. The ferroelectric layer 2 can contain, for example, aluminum nitride (AlN) as the main component, and can contain boron (B) as a sub-component within the range of 2 at % (inclusive) to 10 at % (inclusive). The ferroelectric layer 2 can have a thickness within the range of, for example, 5 nm (inclusive) to 20 nm (inclusive). The ferroelectric layer 2 is preferably thin as long as it maintains ferroelectricity. The sub-component may be, for example, scandium (Sc). In this case, the Sc addition amount preferably falls within the range of, for example, 5 at % (inclusive) to 45 at % (inclusive). When the ferroelectric layer 2 is deposited or formed on the tunnel barrier layer 3, a junction between the tunnel barrier layer 3 and the ferroelectric layer 2 is formed.

The second electrode 4 can be deposited on the ferroelectric layer 2. The second electrode 4 can be made of a conductor film such as TiN. The second electrode 4 can have a thickness of, for example, 10 nm (inclusive) to 50 nm (inclusive).

To manufacture the stacked structure 100″ or the ferroelectric tunnel junction, a sputtering film-forming method can be employed. Here, the process from formation of the underlying layer 6 to formation of the second electrode 4 is preferably executed under a vacuum environment without exposure to atmosphere.

FIG. 4 shows an example of the configuration of one memory cell MC of a memory device according to an embodiment. The memory cell MC can include a capacitor C formed by a stacked structure represented by the above-described stacked structures 100, 100′ and 100″, and a selection transistor ST. Like the above-described stacked structures 100, 100′, and 100″, the capacitor C can include a first electrode 1, a second electrode 4, and a ferroelectric layer 2 and a tunnel barrier layer 3, which are arranged between the first electrode 1 and the second electrode 4.

One of the first electrode 1 and the second electrode 4 of the capacitor C can be connected to a bit line BL via the selection transistor ST, and the other of the first electrode 1 and the second electrode 4 can be connected to a plate line PL. The gate of the selection transistor ST can be connected to a word line WL.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-107796, filed Jun. 29, 2021 which is hereby incorporated by reference herein in its entirety.

What is claimed is:

1. A stacked structure comprising a ferroelectric layer, a tunnel barrier layer joined to the ferroelectric layer, a first electrode, and a second electrode, wherein the ferroelectric layer and the tunnel barrier layer are arranged between the first electrode and the second electrode, the stacked structure comprising:

an underlying layer; and a seed layer arranged on the underlying layer, wherein the first electrode is arranged on the seed layer, wherein a main component of the ferroelectric layer is aluminum nitride, and a main component of the tunnel barrier layer is magnesium oxide, wherein the underlying layer is made of one of ruthenium and platinum.

2. The stacked structure according to claim 1, wherein the ferroelectric layer has a wurtzite structure, and a (001) surface of the wurtzite structure is along a junction surface between the ferroelectric layer and the tunnel barrier layer.

3. The stacked structure according to claim 1, wherein the tunnel barrier layer has an NaCl structure, and a (111) surface of the NaCl structure is along a junction surface between the ferroelectric layer and the tunnel barrier layer.

4. The stacked structure according to claim 1, wherein the ferroelectric layer has a wurtzite structure, and the tunnel barrier layer has an NaCl structure, and a (001) surface of the wurtzite structure and a (111) surface of the NaCl structure are along a junction surface between the ferroelectric layer and the tunnel barrier layer.

5. The stacked structure according to claim 1, wherein the first electrode is a lower electrode, and the second electrode is an upper electrode, and the tunnel barrier layer is arranged between the first electrode and the ferroelectric layer.

6. The stacked structure according to claim 1, wherein the first electrode includes a facing surface that faces the second electrode via the ferroelectric layer and the tunnel barrier layer, the first electrode has an NaCl structure, and a (111) surface of the NaCl structure of the first electrode is along the facing surface.

7. The stacked structure according to claim 1, wherein the ferroelectric layer contains boron at a concentration of 2 at % (inclusive) to 10 at % (inclusive).

8. The stacked structure according to claim 1, wherein the ferroelectric layer contains scandium at a concentration of 5 at % (inclusive) to 45 at % (inclusive).

9. A memory device comprising a capacitor including a stacked structure defined in claim 1.

10. The stacked structure according to claim 1, wherein the seed layer is made of one of ruthenium, platinum, nickel and titanium.

11. A method of manufacturing a stacked structure, comprising:

forming an underlying layer by one of ruthenium and platinum;

forming a seed layer on the underlying layer;

forming an electrode on the seed layer; and forming, on the electrode, layers including a ferroelectric layer and a tunnel barrier layer, which form a junction, wherein a main component of the ferroelectric layer is aluminum nitride, and a main component of the tunnel barrier layer is magnesium oxide.

12. The method according to claim 11, wherein the tunnel barrier layer is formed on the ferroelectric layer.

13. The method according to claim 11, wherein the ferroelectric layer is formed on the tunnel barrier layer.

14. The method according to claim 11, wherein the ferroelectric layer has a wurtzite structure, and a (001) surface of the wurtzite structure is along a junction surface between the ferroelectric layer and the tunnel barrier layer.

15. The method according to claim 11, wherein
the tunnel barrier layer has an NaCl structure, and a (111) surface of the NaCl structure is along a junction surface between the ferroelectric layer and the tunnel barrier layer.

16. The method according to claim 11, wherein the seed layer is formed on the underlying layer by one of ruthenium, platinum, nickel, and titanium.

* * * * *